United States Patent
Hussein et al.

(10) Patent No.: US 7,071,554 B2
(45) Date of Patent: Jul. 4, 2006

(54) STRESS MITIGATION LAYER TO REDUCE UNDER BUMP STRESS CONCENTRATION

(75) Inventors: Makarem A. Hussein, Beaverton, OR (US); Jun He, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 10/856,307

(22) Filed: May 27, 2004

(65) Prior Publication Data

US 2005/0275095 A1    Dec. 15, 2005

(51) Int. Cl.
*H01L 23/48*    (2006.01)
*H01L 21/44*    (2006.01)

(52) U.S. Cl. .................. 257/737; 257/762; 438/613
(58) Field of Classification Search ............. 257/737, 257/762, 632; 438/613
See application file for complete search history.

(56) References Cited

U.S. PATENT DOCUMENTS

| 6,614,112 B1 * | 9/2003 | Uchida ................ 257/737 |
| 6,630,736 B1 * | 10/2003 | Ignaut ................ 257/737 |
| 6,649,515 B1 | 11/2003 | Moon et al. ............ 438/637 |
| 6,774,037 B1 | 8/2004 | Hussein et al. .......... 438/666 |

OTHER PUBLICATIONS

Valery M. Dubin et al., "Use of Conductive Electrolessly Deposited Etch Stop Layers, Liner Layers and Vi Plugs In Interconnected Structures", U.S. Appl. No. 10/139,052, filed May 3, 2002.

Jun He et al., "Mechanically Robust Interconnect for Low-K Dielectric Material Using Post Treatment", U.S. Appl. No. 10/253,723, filed Sep. 24, 2002.

* cited by examiner

*Primary Examiner*—Mark V. Prenty
(74) *Attorney, Agent, or Firm*—Michael D. Plimier

(57) ABSTRACT

In some embodiments, the invention provides a stress mitigation layer that reduces stress in a layer of a microelectronic device that is below a conductive connection structure, such as a bump.

14 Claims, 9 Drawing Sheets

STRESS MITIGATION LAYER TO REDUCE UNDER BUMP STRESS CONCENTRATION

BACKGROUND

BACKGROUND OF THE INVENTION

In a microelectronic structure, such as a microprocessor die, conductors, are separated by dielectric materials. Low dielectric constant ("k value") materials are desirable as dielectrics between the conductors because they reduce resistance capacitance ("RC") delay and improve device performance. However, these low-k value dielectrics typically have weak mechanical properties, and are unable to withstand as much stress as higher-k value dielectric materials. This has prevented the use of low-k dielectric materials in some applications.

DETAILED DESCRIPTION

Figure 1:
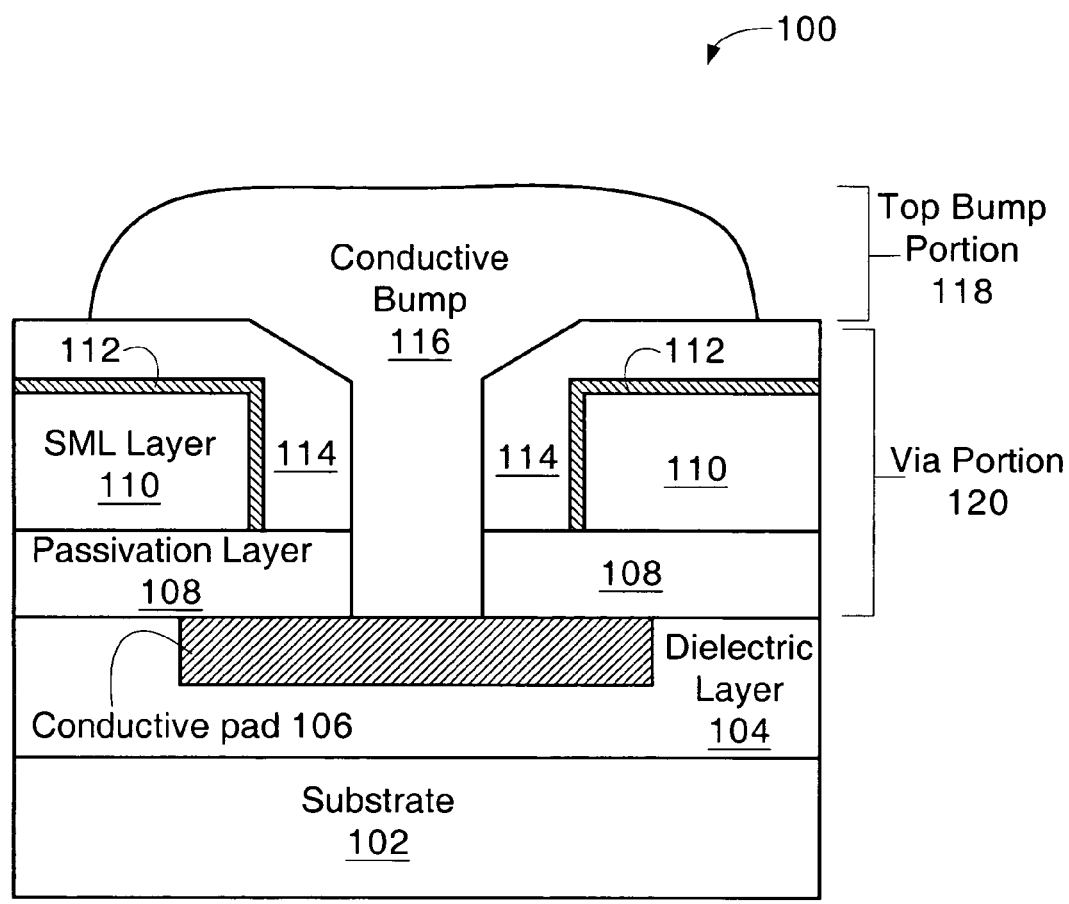
FIG. 1 is a cross sectional side view of a microelectronic structure according to one embodiment of the present invention.

FIG. 1 is a cross sectional side view of a microelectronic structure 100 according to one embodiment of the present invention. The microelectronic structure 100 may include a substrate 102 in one embodiment. The substrate 102 may be one of a wide selection of surfaces used or made during semiconductor or other processing methods. The substrate 102 may comprise, for example, active and/or passive devices that are formed on a silicon wafer, such as transistors, capacitors, resistors, local interconnects, and others. The substrate 102 may be a physical structure, a layer that is a basic workpiece transformed and/or added to by various processes into the desired microelectronic configuration, or another material or materials. The substrate 102 may include conducting material, insulating material, semiconducting material, and other materials or material combinations. In some embodiments, the substrate 102 may be a multilayered structure. In one embodiment, the substrate 102 may include one or more layers, each layer including one or more of metal conductors, dielectric materials, etch stop material, or other materials.

For example, in one embodiment, the substrate 102 may include one or more layers of conductive traces and vias separated by dielectric material. In such an embodiment, the substrate 102 may be part of a microprocessor die or other microelectronic component. For increased performance, it may be desirable to use low dielectric constant ("k value") materials as the dielectric material in the substrate 102. These low-k materials may not withstand stress as well as higher-k value materials.

The structure 100 may include a dielectric layer 104, a conductive pad 106, and a conductive bump 116. The dielectric layer 104 may be an interlayer dielectric ("ILD") layer. For enhanced performance, it may be desirable to use a low-k material as the dielectric material for the dielectric layer 104. These low-k materials may not withstand stress as well as higher-k value materials. The conductive pad 106 may be electrically connected to a conductor within the substrate 102 by a conductor (not shown) passing through the dielectric layer 104. The conductive pad 106 may be electrically connected to the conductive bump 116, which may include a top bump portion 118 extending above a surface of the structure 100 and a via potion 120 extending from the top portion through one or more layers of the structure 100 to contact the conductive pad 106. The top bump portion 118 and via portion 120 may be separate materials or layers, or may simply be different areas of a single physical feature. The conductive bump 116 may allow the structure 100 to be electrically connected to other microelectronic or other devices. Other conductive connection structures besides a bump 116 may be used instead of the bump 116.

Stress may be generated at or near the dielectric layer 104 if and when the conductive bump 116 is connected to another structure or device, or at other times. For example, if the conductive bump 116 is heated, thermal expansion may cause stresses to develop in the conductive bump 116, conductive pad 106 or dielectric layer 104. The stress may tend to crack the dielectric layer under or near the conductive pad 106. Mitigating this stress may allow low-k dielectrics to be used in the dielectric layer 104 and elsewhere in the structure 100 that they could not be used if the stress were not mitigated.

The structure 100 may include a stress mitigation layer (SML) 110 to mitigate such stress and prevent cracks or failures of a low-k value dielectric material in the dielectric layer 104. In some embodiments, the stress mitigation layer 110 may comprise a layer of a ductile material such as copper. The stress mitigation layer 110 may be on a passivation layer 108 that at least partially covers the dielectric layer 104 and/or the conductive pad 108. The stress mitigation layer 110 may decrease the stress transmitted to the dielectric layer 104 enough to prevent the dielectric layer 104 from cracking or failing, even if the dielectric layer 104 comprises a relatively mechanically weak low-k dielectric material.

The structure 100 may also include other layers, such as a barrier layer 112 over the stress mitigation layer 110 and/or an insulating layer 114. Other layers may also be used in other embodiments, and some embodiments may include fewer than all the layers described.

Figure 2:
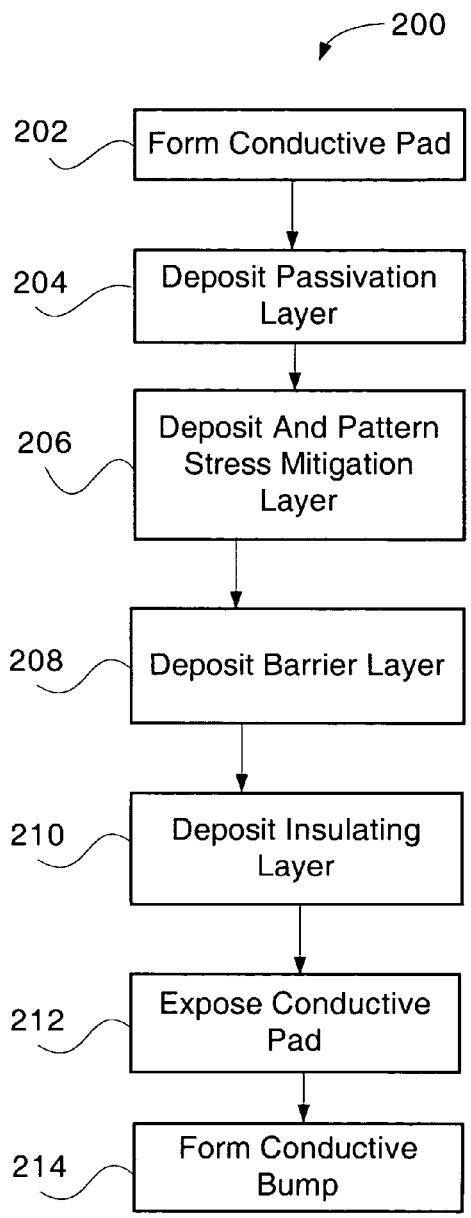
FIG. 2 is a flow chart that illustrates a method for fabricating a microelectronic structure.

FIG. 2 is a flow chart 200 that illustrates a method for fabricating a microelectronic structure, such as the microelectronic structure 100 of FIG. 1, according to one embodiment of the present invention. In other embodiments, some of the steps shown in the flow chart 200 may be omitted, other steps may be added, and/or the steps shown may be performed in a different order.

The conductive pad 106 may be formed 202 on or in the dielectric layer 104, which may be on the substrate 102. The conductive pad 106 may comprise copper or another conductive material. The conductive pad 106 may have an electrical connection (not shown) through the dielectric layer 104 to other conductors or devices in the substrate 102. In an embodiment, a passivation layer 108 may be deposited 204 on the conductive pad 106. This passivation layer 108 may comprise a nitride or another material.

Figure 4:
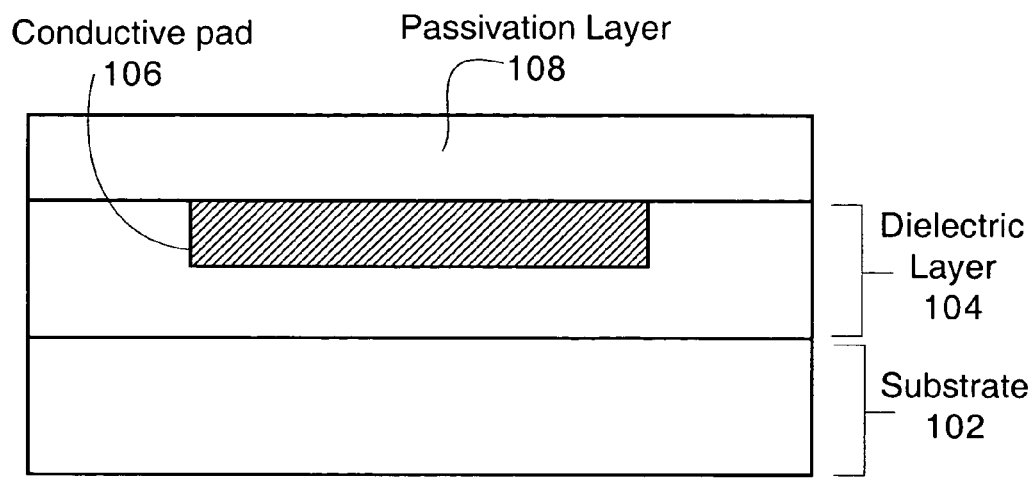
FIG. 4 is a cross sectional side view that illustrates the substrate, the dielectric layer, the conductive pad, and the passivation layer.

FIG. 4 is a cross sectional side view that illustrates the substrate 102, the dielectric layer 104, the conductive pad 106, and the passivation layer 108. In some embodiments, the dielectric layer 104 may comprise silicon dioxide, silicon nitride, silicon oxy-nitride, porous oxide, a siloxane-based polymer, carbon doped oxide, a polyarylene-based dielectric material, a poly(aryl ether)-based polymeric dielectric material, or another material.

Figure 3:
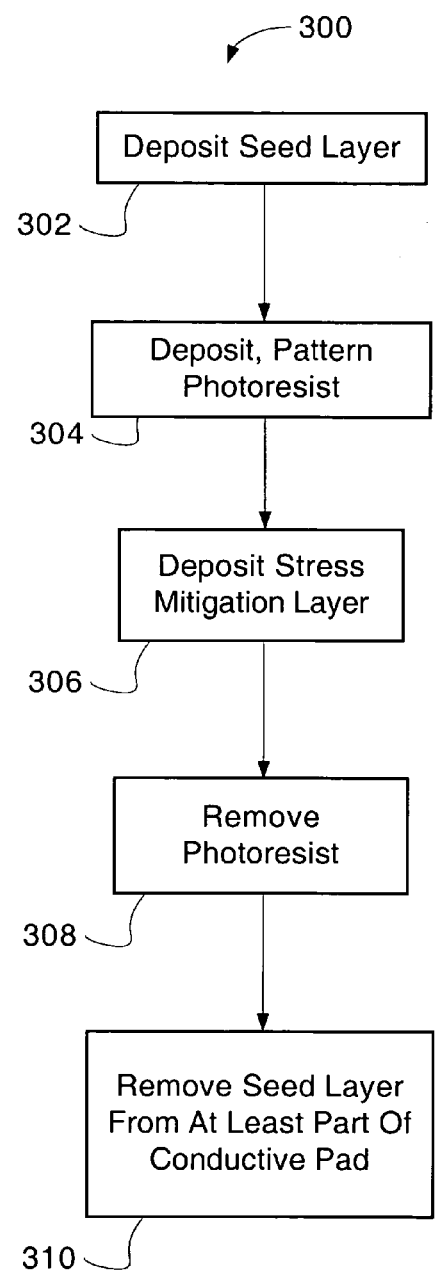
FIG. 3 is a flow chart that illustrates a method for depositing a patterned stress mitigation layer according to one embodiment of the present invention.
Figure 5:
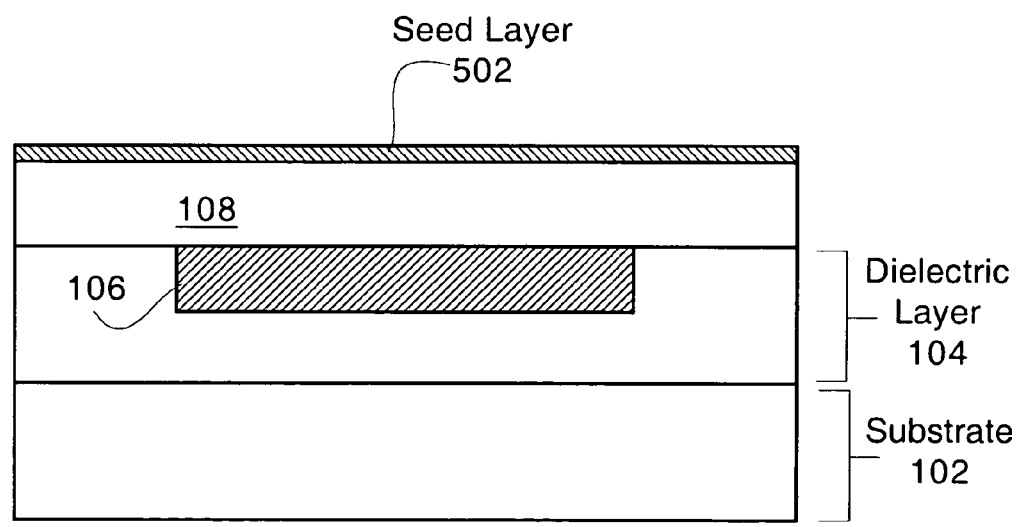
FIG. 5 is a cross sectional side view that illustrates a seed layer deposited on a passivation layer.

Returning to FIG. 2, a stress mitigation layer 110 may then be deposited and patterned. FIG. 3 is a flow chart 300 that illustrates a method for depositing a patterned stress mitigation layer 110 according to one embodiment of the present invention. A seed layer 502 may be deposited 302. FIG. 5 is a cross sectional side view that illustrates a seed layer 502 deposited on a passivation layer 108 according to one embodiment. The seed layer 502 may be a thin layer of a conductive material. The material may comprise copper in some embodiments. The seed layer 502 may be deposited 302 by sputtering the material that makes up the seed layer 502 onto the passivation layer 108 in one embodiments, although other methods may be used to deposit the seed layer 502.

Figure 6:
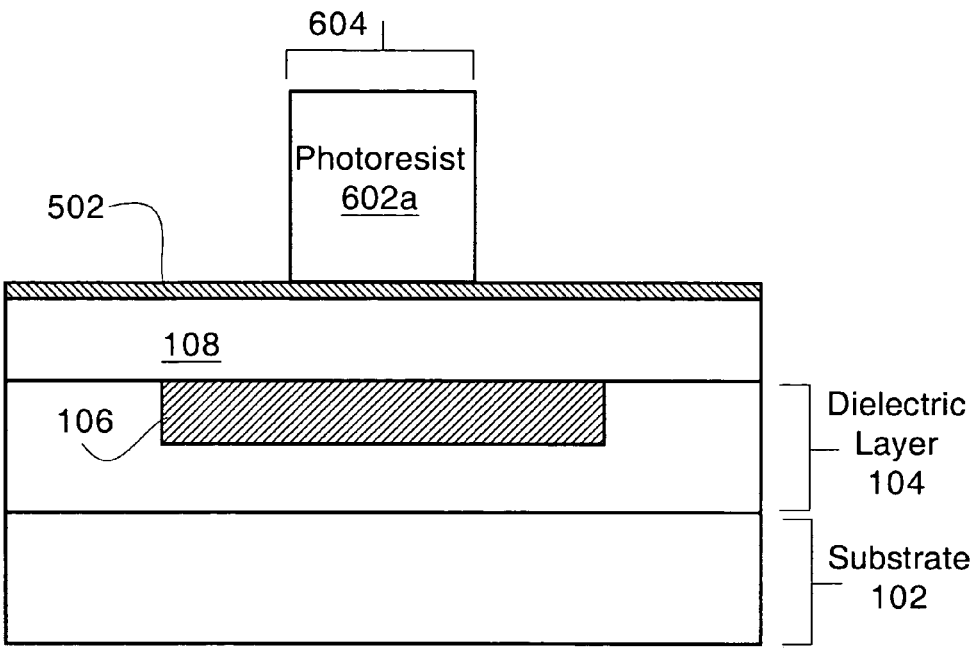
FIGS. 6 and 7 are cross sectional side views that illustrate patterned photoresist on the seed layer.
Figure 7:
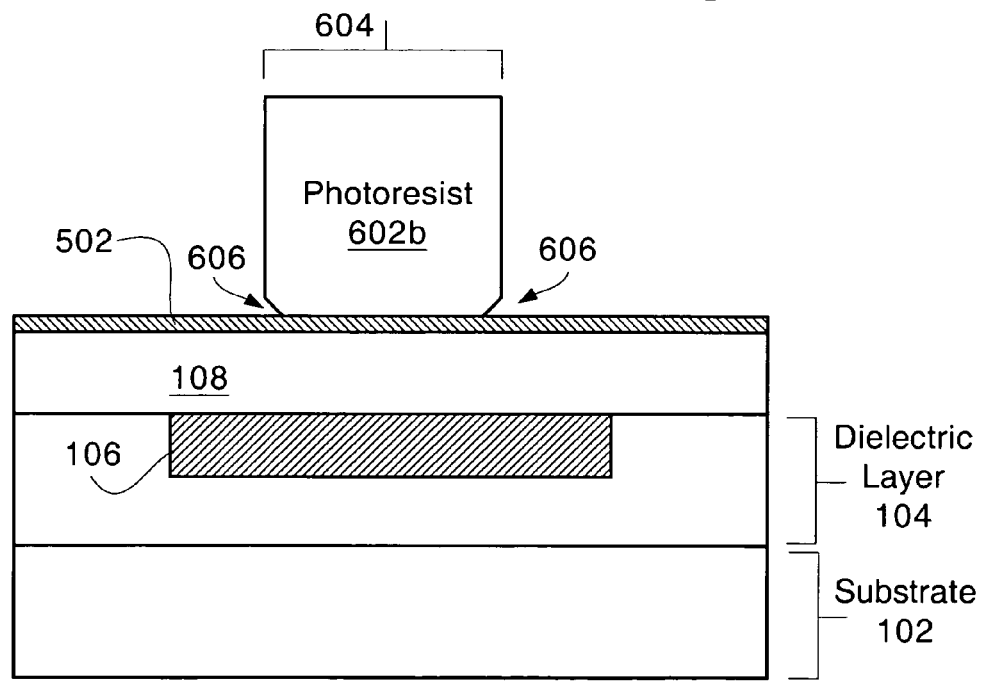

Returning to FIG. 3, a layer of photoresist may then be deposited 304 and patterned. The photoresist may be exposed and developed to pattern the photoresist. FIGS. 6 and 7 are cross sectional side views that illustrate patterned photoresist 602a (in FIG. 6), 602b (in FIG. 7) on the seed layer 502 according to two alternate embodiments. In some embodiments, the patterned photoresist 602a, 602b has a width 604 approximately twice that of a width of the via portion 120 of the conductive bump 116 adjacent to where the bump 116 contacts the conductive pad 106. In some embodiments, this width 604 is about 20 microns. In other embodiments, the width 604 may be about 10 microns or more. In some embodiments, the patterned photoresist 602a, 602b has a substantially rectangular cross section as seen from the top of approximately 20 microns by 20 microns, although other widths and sizes may be used in other embodiments. The patterned photoresist 602b in FIG. 7 is similar to the patterned photoresist 602a in FIG. 6. However, the patterned photoresist 602b in FIG. 7 includes undercut portions 606, while the patterned photoresist 602a in FIG. 6 has side walls that extend approximately straight from the top of the patterned photoresist 602a to the seed layer 502. In other embodiments, the patterned photoresist 602 may have other shapes. For example, in an embodiment, the side walls of the patterned photoresist 602 may be sloped instead of straight up and down.

Figure 8:
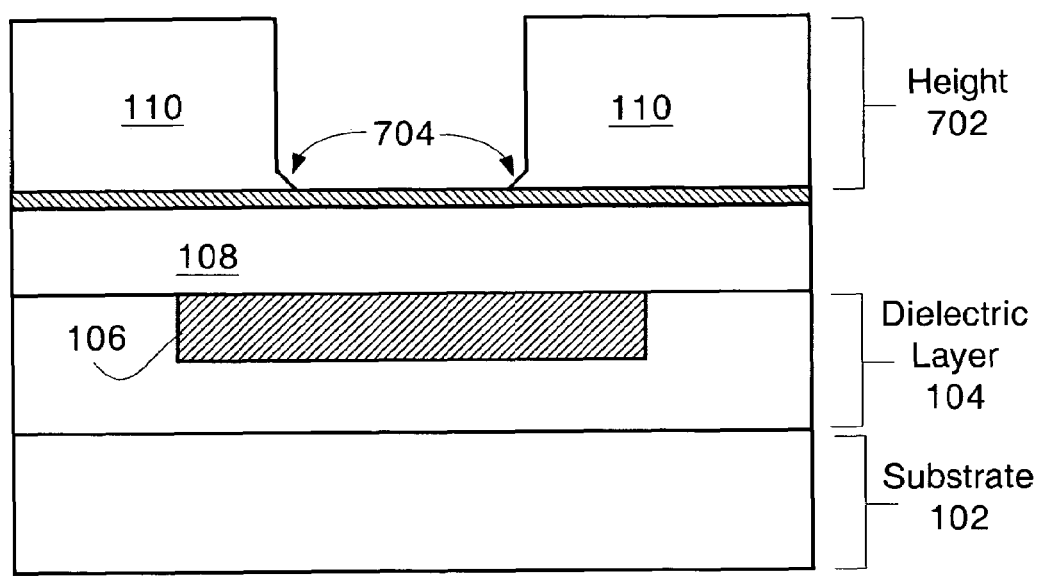
FIG. 8 is a cross sectional side view that illustrates a stress mitigation layer on the seed layer after the stress mitigation layer is deposited and the patterned photoresist is removed.

Returning to FIG. 3, the stress mitigation layer 110 may be deposited 306. The stress mitigation layer 110 may cover most of the surface of the layers of the structure 100 beneath the SML 110. In an embodiment, the SML 110 may cover more than 75 percent of the surface. In an embodiment, except for areas occupied by the bump opening and other test structures, substantially the whole surface may be covered by the SML 110. In other embodiments, the SML 110 may cover less of the surface area. The patterned photoresist 602 may then be removed 308. FIG. 8 is a cross sectional side view that illustrates a stress mitigation layer 110 on the seed layer 502 after the stress mitigation layer 110 is deposited 306 and the patterned photoresist 602 is removed 308. In an embodiment, the photoresist 602 may be removed by a wet process compatible with the material of the stress mitigation layer 110.

The deposited stress mitigation layer 110 illustrated in FIG. 8 includes footing sections 704 that extend out further than the rest of the side walls of the stress mitigation layer 110. This may result from, for example, the stress mitigation layer 110 being deposited adjacent patterned photoresist 602b with undercut portions 606, as illustrated in FIG. 7. In other embodiments with other shapes of patterned photoresist 602, the deposited stress mitigation layer 110 may have other shapes. Additionally, the top surface of the stress mitigation layer 110 may be rough, non-uniform, or non-planar. It is not necessary to polish or planarize the surface of the stress mitigation layer 110 in some embodiments.

In an embodiment, the stress mitigation layer 110 may be deposited using a method such as electroplating, or another method. The stress mitigation layer 110 may comprise copper, or another ductile material. The deposited stress mitigation layer 110 may have a height 702 in a range from about 1 micron to about 5 microns in one embodiment. In another embodiment, the deposited stress mitigation layer 110 may have a height 702 up to about 15 microns. In yet other embodiments, the height 702 of the stress mitigation layer 110 may be less then 1 micron or greater than 15 microns, or greater than 20 microns. The height 702 may be chosen to be less than a height of the photoresist 602, to prevent encapsulating the photoresist 602 within the stress mitigation layer 110.

Figure 9:
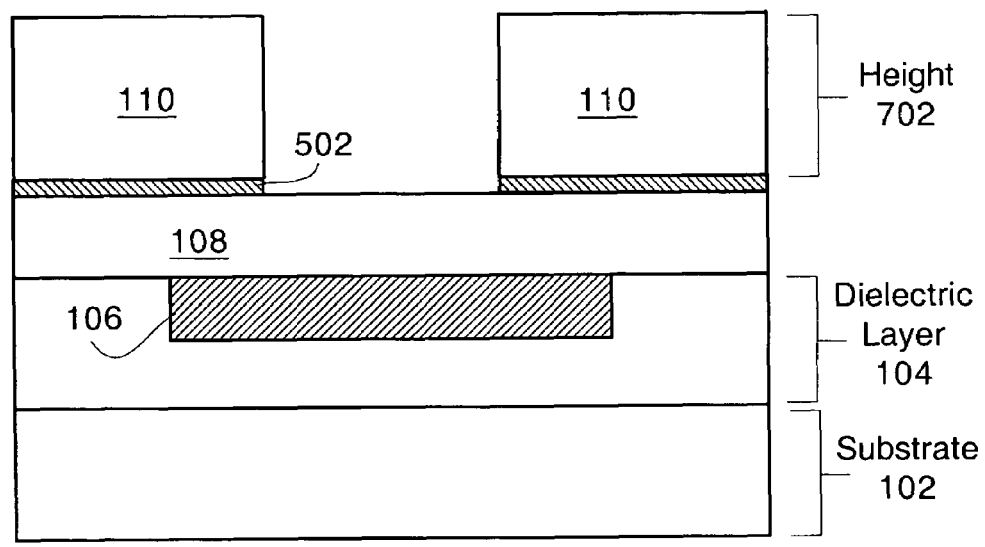
FIG. 9 is a cross sectional side view that illustrates the removed portion of the seed layer.

The height 702 may be chosen based on the desired reduction in stress in layers below the stress mitigation layer 110. For example, in an embodiment a height 702 of the stress mitigation layer 110 of about 15 microns may produce the largest stress reduction in layers below the stress mitigation layer 110. If maximum stress reduction is desired, this height 702 may be used. Alternatively, a smaller height 702 than that which provides the most stress reduction may be chosen. Such a smaller height 702 may reduce stress enough to reduce or eliminate cracks or failures of the low-k dielectric material. Greater heights may also be chosen in other embodiments Returning again to FIG. 3, a portion of the seed layer 502 may be removed 310. The seed layer 502 may be removed 310 from an area at least partially above the conductive pad 106 in an embodiment. In other embodiments, the seed layer 502 may be removed 310 from a different area. A wet etching process may be used to remove 310 the seed layer, or another process may be used. FIG. 9 is a cross sectional side view that illustrates the removed portion of the seed layer 502. The footing sections 704 of the stress mitigation layer 110 may prevent undercuts from being formed in the stress mitigation layer 110 during removal of the seed layer 502 portion. The height 702 of the stress mitigation layer 110 after removal 310 of the seed layer 502 may be substantially the same as before the removal 310. If removing 310 the seed layer 502 substantially alters the height of the stress mitigation layer 110, the height before removal 310 of the seed layer 502 may be chosen so that the height of the stress mitigation layer 110 after removal 310 of the seed layer 502 is as described above with respect to FIGS. 7, 8a, and 8b.

Figure 10:
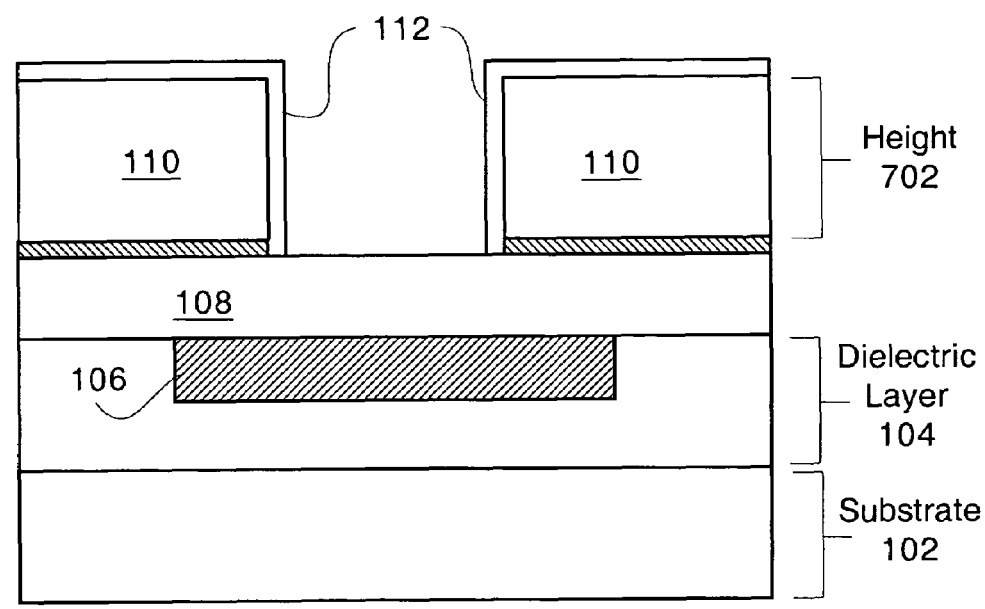
FIG. 10 is a cross sectional side view that illustrates a barrier layer deposited on the stress mitigation layer.

Referring now again to FIG. 2, a barrier layer 112 may be deposited 208 in some embodiments. FIG. 10 is a cross sectional side view that illustrates a barrier layer 112 deposited on the stress mitigation layer 110. Such a barrier layer 112 may be used, for example, if the stress mitigation layer 110 comprises copper, which may diffuse into layer 114 without such a barrier layer 112. In an embodiment, an electroless cobalt plating method may be used to deposit a barrier layer 112 comprising cobalt. In other embodiments, other materials, such as a nitride, may be used as the barrier layer 112. A nitride barrier layer 112 may be deposited using a chemical vapor deposition ("CVD") method or another method.

Figure 11:
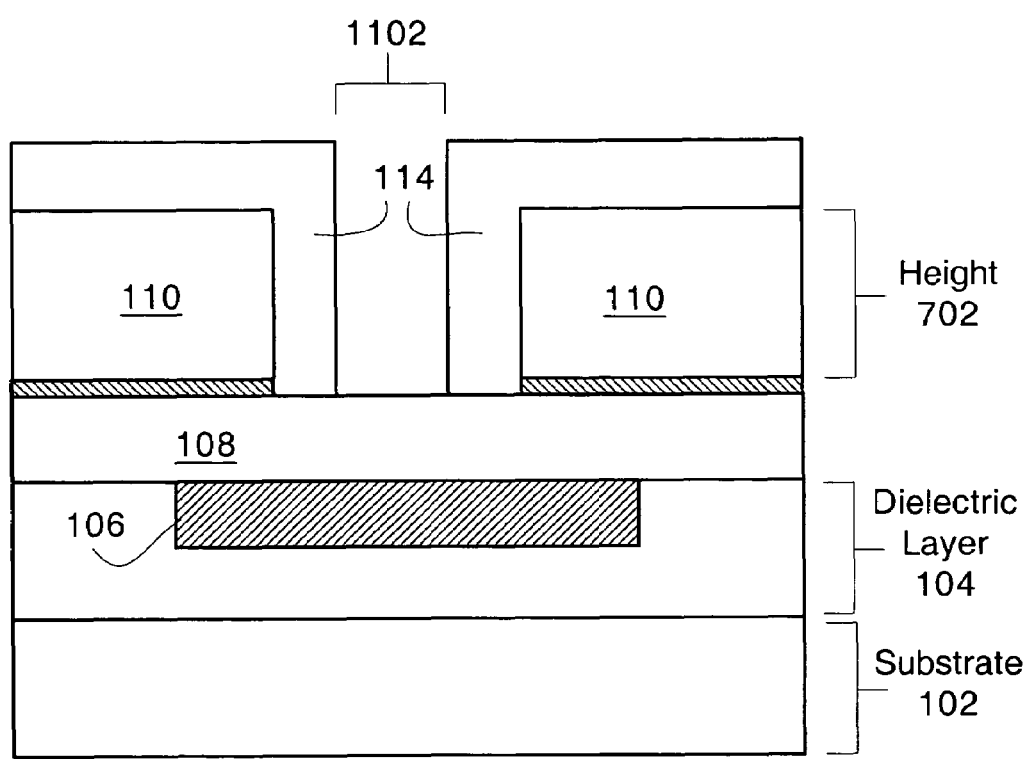
FIG. 11 is a cross sectional side view that illustrates a deposited insulating layer.

Returning to FIG. 2, an insulating layer may be deposited 210 in some embodiments. FIG. 11 is a cross sectional side view that illustrates a deposited insulating layer 114. For simplicity, the barrier layer 112 is not shown in FIG. 11 (also note that some embodiments may lack a barrier layer 112). In one embodiment, the insulating layer 114 may comprise a polyimide material or another material. In an embodiment, a polyimide insulating layer 114 may be deposited 210 by spinning on photo-definable polyimide material, exposing the material, and developing the material to result in the insulating layer 114 shown in FIG. 11, with an opening 1102 in the insulating layer 114 extending to the passivation layer 108.

Figure 12:
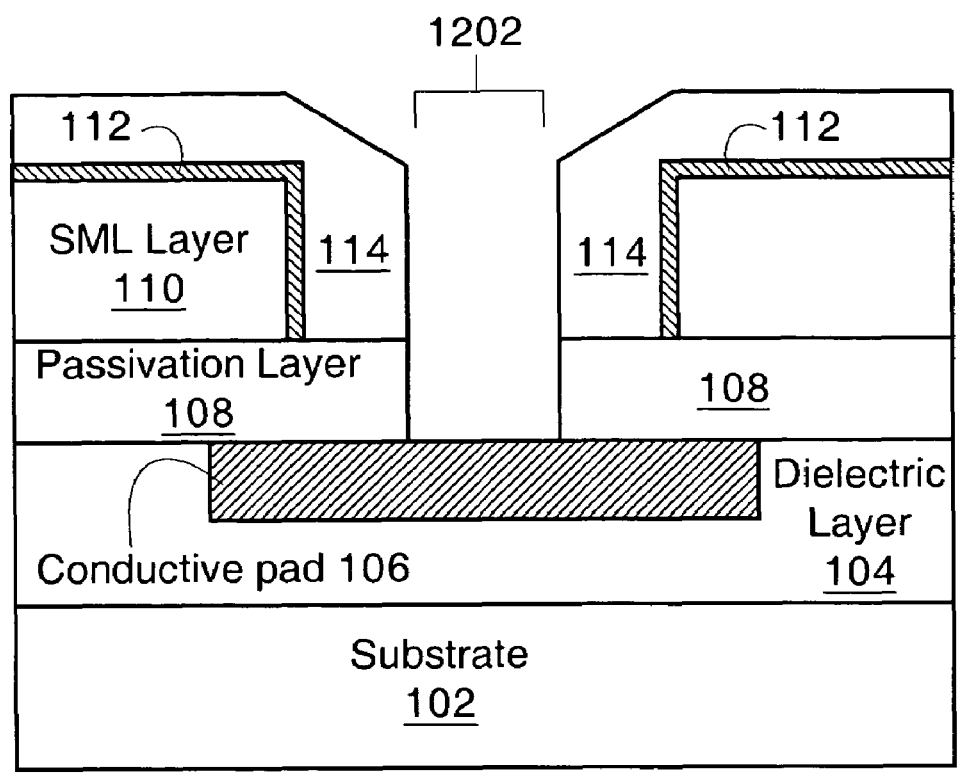
FIG. 12 is a cross sectional side view that illustrates an exposed conductive pad.

Returning to FIG. 2, the conductive pad 106 may be exposed 212. FIG. 12 is a cross sectional side view that illustrates an exposed conductive pad 106. The passivation layer 108 may be etched to remove a portion above the conductive pad 106 to reveal the conductive pad 106. Other processes may also be used to remove the passivation layer 108. A portion of the insulating layer 114 may also be removed by this process to result in a profile similar to that shown in FIG. 12. The opening 1202 through the insulating layer 114, stress mitigation layer 110, and passivation layer 108 may have a width of about 10 microns in one embodiment, although other embodiments may have other widths.

Returning again to FIG. 2, a conductive bump may be formed 214. One embodiment of a formed 214 conductive bump 116 is illustrated in FIG. 1, described above. The conductive bump 116 may be formed 214 by known methods to make controlled collapse chip connect (C4) bumps, or by other methods or processes. The conductive bump 116 may have a "mushroom" shape as shown in FIG. 1, or may have another shape.

Figure 13:
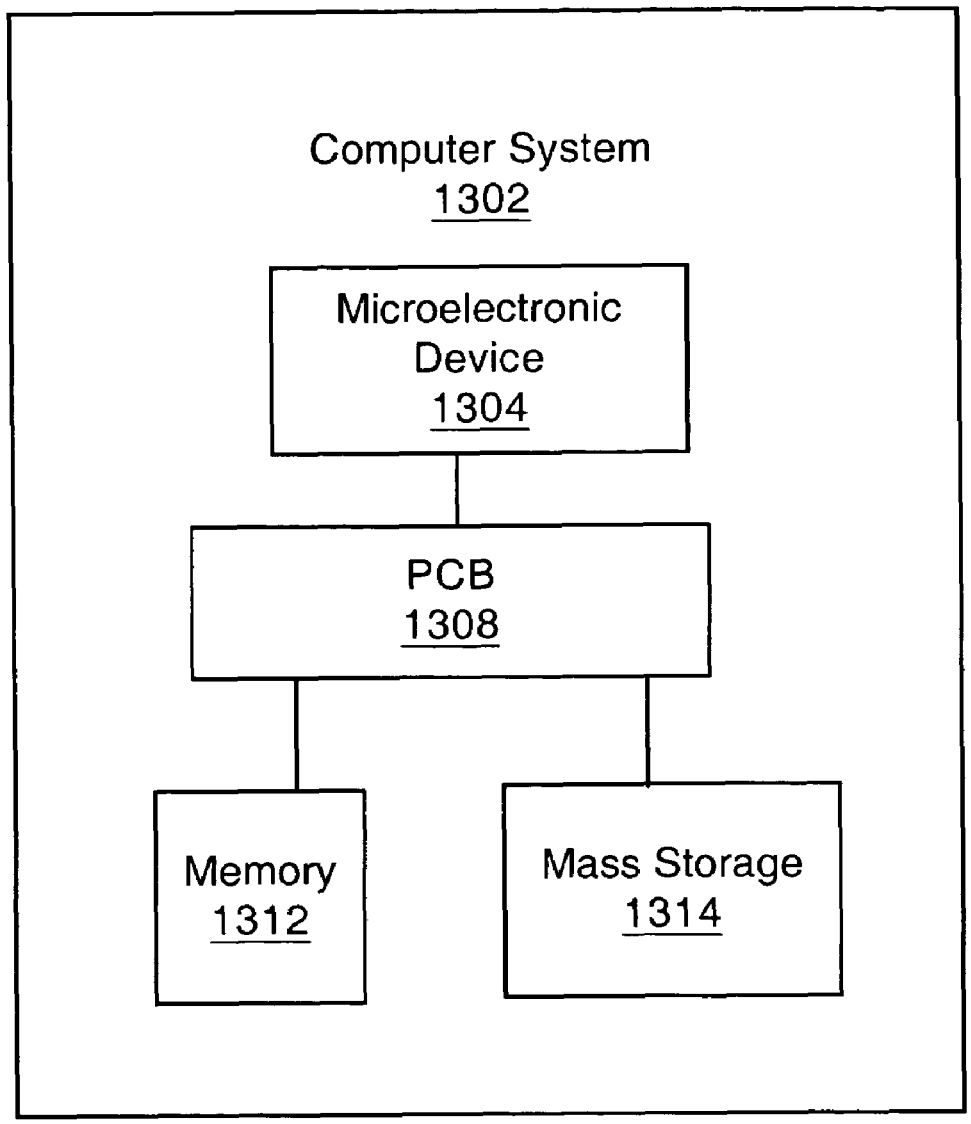
FIG. 13 is a schematic diagram of a computer system according to one embodiment of the present invention.

FIG. 13 is a schematic diagram of a computer system 1302 according to one embodiment of the present invention. The computer system 1302 may include the structure 100 described above. The structure 100 may be part of a microprocessor die or other microelectronic device that may form all or part of a microelectronic device module 1304. The microelectronic device module 1304 may be connected to a structure such as a printed circuit board ("PCB") 1308 by connectors such as solder balls or other connectors. Additionally, the computer system 1302 may include a memory 1312 and/or a mass storage unit 1314, which may be connected to the PCB 1308. The memory 1312 may be any memory, such as random access memory, read only memory, or other memories. The mass storage unit 1314 may be a hard disk drive or other mass storage device. The computer system 1302 may also include other components such as input/output units, a microprocessor, or other components.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

I claim:

1. A device, comprising:
 a dielectric layer;
 a conductive pad on the dielectric layer;
 a stress mitigation layer on the conductive pad, the stress mitigation layer comprising copper and having a thickness in a range of about 2 microns to about 20 microns;
 an insulating layer on the stress mitigation layer; and
 a conductive bump having a top bump portion at least partially on the insulating layer and a via portion extending from the top bump portion through the stress mitigation layer to contact the conductive pad.

2. The device of claim 1, wherein the dielectric layer comprises a low dielectric constant material.

3. The device of claim 2, wherein the dielectric layer comprises at least one of silicon dioxide, silicon nitride, silicon oxy-nitride, porous oxide, a siloxane-based polymer, carbon doped oxide, a polyarylene-based dielectric material, or a poly(aryl ether)-based polymeric dielectric material.

4. A device comprising:
 a dielectric layer;
 a conductive pad on the dielectric layer;
 a stress mitigation layer on the conductive pad;
 an insulating layer on the stress mitigation layer; and
 a conductive bump having a top bump portion at least partially on the insulating layer and a via portion extending from the top bump portion through the stress mitigation layer to contact the conductive pad;
wherein the stress mitigation layer has a thickness in a range of about 0.5 microns to about 5 microns.

5. The device of claim 1, further comprising a passivation layer on the conductive pad and the dielectric layer, wherein:
 the dielectric layer comprises a low dielectric constant value material;
 the conductive pad comprises copper;
 the insulating layer comprises a polyimide layer; and
 the conductive bump comprises copper.

6. The device of claim 5, wherein the device comprises a microelectronic die, further comprising:
 a structural support connected to the die;
 memory electrically coupled to the die; and
 a mass storage unit electrically coupled to the die.

7. A microelectronic die, comprising:
 a substrate;
 a interlayer dielectric layer on the substrate;
 a conductive pad on at least a portion of the interlayer dielectric layer;
 a passivation layer on the conductive pad and interlayer dielectric layer;

a ductile metallic stress mitigation layer comprising copper and having a thickness in a range of about 2 microns to about 20 microns on the passivation layer; and a conductive bump having a top bump portion above the stress mitigation layer and a via portion extending from the top bump portion through the stress mitigation layer to contact the conductive pad.

8. The microelectronic die of claim 7, wherein the stress mitigation layer extends over at least about 75% of the area of the substrate.

9. The microelectronic die of claim 7, wherein the stress mitigation layer has a thickness in a range of about 5 microns to about 15 microns.

10. The microelectronic die of claim 7, further comprising a polyimide layer over the stress mitigation layer, wherein the via portion of the conductive bump extends from the top bump portion through the polyimide layer as well as the stress mitigation layer.

11. The microelectronic die of claim 7, wherein the conductive bump comprises copper and the interlayer dielectric layer comprises a low dielectric constant value material.

12. A method, comprising:
 forming a dielectric layer on a substrate;
 forming a conductive pad on the dielectric layer;
 forming a passivation layer on the conductive pad;
 forming a patterned ductile metallic stress mitigation layer on the passivation layer, the stress mitigation layer having a thickness in a range of about 1 micron to about 20 microns, the stress mitigation layer patterned to include side walls defining an opening through the stress mitigation layer to the passivation layer;
 forming an insulating layer on the top and side walls of the stress mitigation layer;
 removing a portion of the passivation layer to form an opening through the passivation layer to the conductive pad; and
 forming a conductive bump comprising a top bump portion at least partially on the insulating layer and a via portion extending from the top bump portion through the stress mitigation layer to contact the conductive pad.

13. The method of claim 12, wherein the stress mitigation layer comprises copper and the conductive bump comprises copper.

14. The method of claim 12, wherein the stress mitigation layer extends over at least about 75% of the area of the passivation layer.

* * * * *